(12) United States Patent
Takahashi et al.

(10) Patent No.: US 11,997,790 B2
(45) Date of Patent: May 28, 2024

(54) COUPLING STRUCTURE IN WIRING BOARD

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP); SUMITOMO ELECTRIC PRINTED CIRCUITS, INC., Shiga (JP)

(72) Inventors: Hideo Takahashi, Mie (JP); Shinichi Takase, Mie (JP); Yoshiro Adachi, Shiga (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 346 days.

(21) Appl. No.: 17/634,763

(22) PCT Filed: Aug. 3, 2020

(86) PCT No.: PCT/JP2020/029620
§ 371 (c)(1),
(2) Date: Feb. 11, 2022

(87) PCT Pub. No.: WO2021/033523
PCT Pub. Date: Feb. 25, 2021

(65) Prior Publication Data
US 2022/0287178 A1    Sep. 8, 2022

(30) Foreign Application Priority Data

Aug. 22, 2019 (JP) ................................ 2019-151906

(51) Int. Cl.
*H05K 1/11* (2006.01)
*H05K 1/14* (2006.01)

(52) U.S. Cl.
CPC ............. *H05K 1/118* (2013.01); *H05K 1/147* (2013.01); *H05K 2201/0212* (2013.01)

(58) Field of Classification Search
None
See application file for complete search history.

(56) References Cited

U.S. PATENT DOCUMENTS

2015/0359083 A1    12/2015   Su et al.

FOREIGN PATENT DOCUMENTS

JP    08-316603        11/1996
JP    2002368370  A  * 12/2002   ............. H05K 3/363
(Continued)

OTHER PUBLICATIONS

JP 2009054929 A (Translation) (Year: 2023).*
(Continued)

*Primary Examiner* — Timothy J Thompson
*Assistant Examiner* — John B Freal
(74) *Attorney, Agent, or Firm* — Greenblum & Bernstein, P.L.C.

(57) ABSTRACT

A coupling structure in a wiring board including a printed wiring board and a flexible printed wiring board overlaid on the printed wiring board. The printed wiring board includes a first conductive line on a surface adjacent to the flexible printed wiring board. The flexible printed wiring board includes a second conductive line on a surface on an opposite side from the printed wiring board. The flexible
(Continued)

printed wiring board includes a conduction-purpose through hole adjacent to the second conductive line and in which a section of the first conductive line is disposed. The first conductive line of the printed wiring board and the second conductive line of the flexible wiring board are electrically connected to each other with a conductive member disposed in the conduction-purpose through hole. The conductive member is covered with a resin having an insulating property.

9 Claims, 17 Drawing Sheets

(56) References Cited

FOREIGN PATENT DOCUMENTS

| | | | |
|---|---|---|---|
| JP | 2005-216915 | | 8/2005 |
| JP | 2005216915 A | * | 8/2005 |
| JP | 2006-324282 | | 11/2006 |
| JP | 2009054929 A | * | 3/2009 |
| JP | 2015-233136 | | 12/2015 |

OTHER PUBLICATIONS

JP 2005216915 A (Translation) (Year: 2023).*
JP 2002368370 A (Translation) (Year: 2023).*
International Search Report issued in International Bureau of WIPO Patent Application No. PCT/JP2020/029620, dated Oct. 20, 2020, along with an English translation thereof.

* cited by examiner

COUPLING STRUCTURE IN WIRING BOARD

TECHNICAL FIELD

The present disclosure relates to a coupling structure in a wiring board.

BACKGROUND ART

A coupling structure of printed wiring boards disclosed in Japanese Unexamined Patent Application Publication No. 2006-324282 has been known. In the above technology, a printed wiring board and a flexible printed wiring board are bonded together. The printed wiring board includes a circuit on one side. The flexible printed wiring board includes at least one layer of a circuit. The flexible printed wiring board includes through holes through which the circuit of the printed wiring board is connected to the circuit of the flexible printed wiring board. With conductive materials filling the through holes, the circuit of the printed wiring board and the circuit of the flexible wiring board are electrically connected to each other.

RELATED ART DOCUMENT

Patent Document

[Patent Document 1]
Japanese Unexamined Patent Application Publication No. 2006-324282

SUMMARY OF THE INVENTION

Problem to be Solved by the Invention

In the above technology, the conductive materials and the through holes are exposed to the outside of the flexible printed wiring board. In an environment in which dew condensation water is produced such as an onboard environment, the dew condensation water may enter into the through holes via the conductive materials. The dew condensation water may result in a short-circuit in the circuit of the printed wiring board or the circuit of the flexible printed wiring board. Therefore, higher waterproof performance has been expected for a coupling structure in a wiring board.

The technology described herein was made in view of the above circumstances. An object is to provide a coupling structure in a wiring board with increased waterproof performance.

Means for Solving the Problem

The present disclosure relates to a coupling structure in a wiring board including a printed wiring board and a flexible printed wiring board overlaid on the printed wiring board. The printed wiring board includes a first conductive line 15 on a surface adjacent to the flexible printed wiring board. The flexible printed wiring board includes a second conductive line on a surface on an opposite side from the printed wiring board. The flexible printed wiring board includes a conduction-purpose through hole adjacent to the second conductive line and in which a section of the first conductive line is disposed. The first conductive line of the printed wiring board and the second conductive line of the flexible wiring board are electrically connected to each other with a conductive member disposed in the conduction-purpose through hole. The conductive member is covered with a resin having an insulating property.

Advantageous Effects of Invention

According to the present disclosure, the waterproof performance of the coupling structure in the wiring board increases.

MODES FOR CARRYING OUT THE INVENTION

Figure 1:
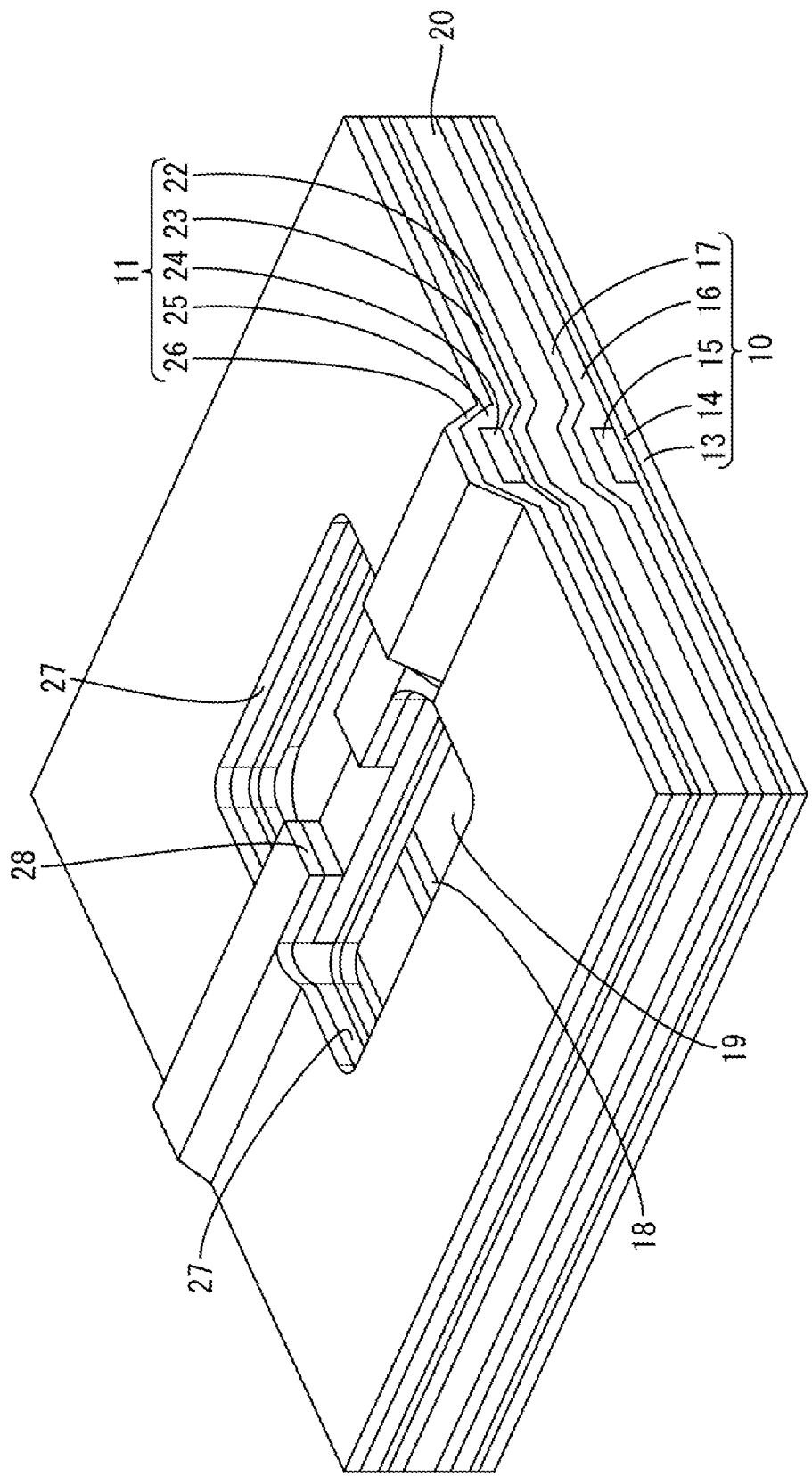
FIG. 1 is a perspective view of a coupling structure in a wiring board according to a first embodiment illustrating multilayer structures of a first flexible printed wiring board and a second flexible printed wiring board.

Description of Embodiments According to the Present Disclosure

First, embodiments of the present disclosure according to the present disclosure will be listed and described.

(1) The present disclosure relates to a coupling structure in a wiring board including a printed wiring board and a flexible printed wiring board overlaid on the printed wiring board. The printed wiring board includes a first conductive line 15 on a surface adjacent to the flexible printed wiring board. The flexible printed wiring board includes a second conductive line on a surface on an opposite side from the printed wiring board. The flexible printed wiring board includes a conduction-purpose through hole adjacent to the second conductive line and in which a section of the first conductive line is disposed. The first conductive line of the printed wiring board and the second conductive line of the flexible wiring board are electrically connected to each other with a conductive member disposed in the conduction-purpose through hole. The conductive member is covered with a resin having an insulating property.

Because the conductive member is covered with the resin having the insulating property, the conductive member is less likely to be subject to dew condensation water and thus the dew condensation water is less likely to enter into the conduction-purpose through hole via the conductive member. According to the configuration, the waterproof performance of the coupling structure in the wiring board improves.

Further, the dew condensation water on the conductive member is less likely to stream down the conductive member and to enter between the printed wiring board and the flexible printed wiring board. According to the configuration, the waterproof performance of the coupling structure in the wiring board improves.

(2) At least one of the printed wiring board and the flexible printed wiring board may include a resin filling-purpose through hole to be filled with the resin between the printed wiring board and the flexible printed wiring board. The resin filling-purpose through hole is filled with the resin.

Through filling the resin filling-purpose through hole with the resin, which is a simple method, the section of the conductive member between the printed wiring board and the flexible printed wiring board is covered with the resin. Therefore, the waterproof performance between the printed wiring board and the flexible printed wiring board improves.

(3) The resin filling-purpose through hole may double as the conduction-purpose through hole.

In comparison to a configuration in which the conduction-purpose through holes and the resin filling-purpose through holes are separately provided, the coupling structure in the wiring board is simplified.

(4) The flexible printed wiring board may include at least one of the conduction-purpose through hole and the resin filling-purpose through hole on at least one of sides of the second conductive line.

According to the configuration in which the conduction-purpose through hole is provided beside the second conductive line, the first conductive line and the second conductive line are electrically connected to each other with ease. According to the configuration in which the resin filling-purpose through hole is provided beside the second conductive line, the conductive member that electrically connects the first conductive line to the second conductive line is easily covered with the resin.

(5) The coupling structure may further include a spacer between the printed wiring board and the flexible printed wiring board. The spacer may include a conduction-purpose void at a position opposite the conduction-purpose through hole and a resin filling-purpose void at a position opposite the resin filling-purpose through hole.

With the spacer between the printed wiring board and the flexible printed wiring board, a space to be filled with the resin is formed between the printed wiring board and the flexible printed wiring board. According to the configuration, the space between the printed wiring board and the flexible printed wiring board is properly filled with the resin. Therefore, the waterproof performance of the coupling structure in the wiring board improves.

(6) The spacer may include surfaces, at least one of which has adhesiveness.

The spacer and the printed wiring board or the flexible printed wiring board are bonded to each other. According to the configuration, water is less likely to enter between the spacer and the printed wiring board or the flexible printed wiring board. Therefore, the waterproof performance of the coupling structure in the wiring board improves.

(7) The coupling structure may be to be installed in a vehicle.

Detail of Embodiment According to the Present Disclosure

Embodiments according to the present disclosure will be described. The present invention is not limited to the embodiments. All modifications within and equivalent to the technical scope of the claimed invention may be included in the technical scope of the present invention.

First Embodiment

A first embodiment including a power storage pack 2 that is to be installed on a vehicle 1 and to which the present disclosure is applied will be described with reference to FIGS. 1 to 14. The power storage pack 2 is installed on the vehicle 1 that may be an electric vehicle or a hybrid vehicle for a power source of the vehicle 1. In the following description, components having the same configuration, some of the components may be indicated by reference signs and others may not be indicated by the reference signs.

[Overall Configuration]

Figure 14:
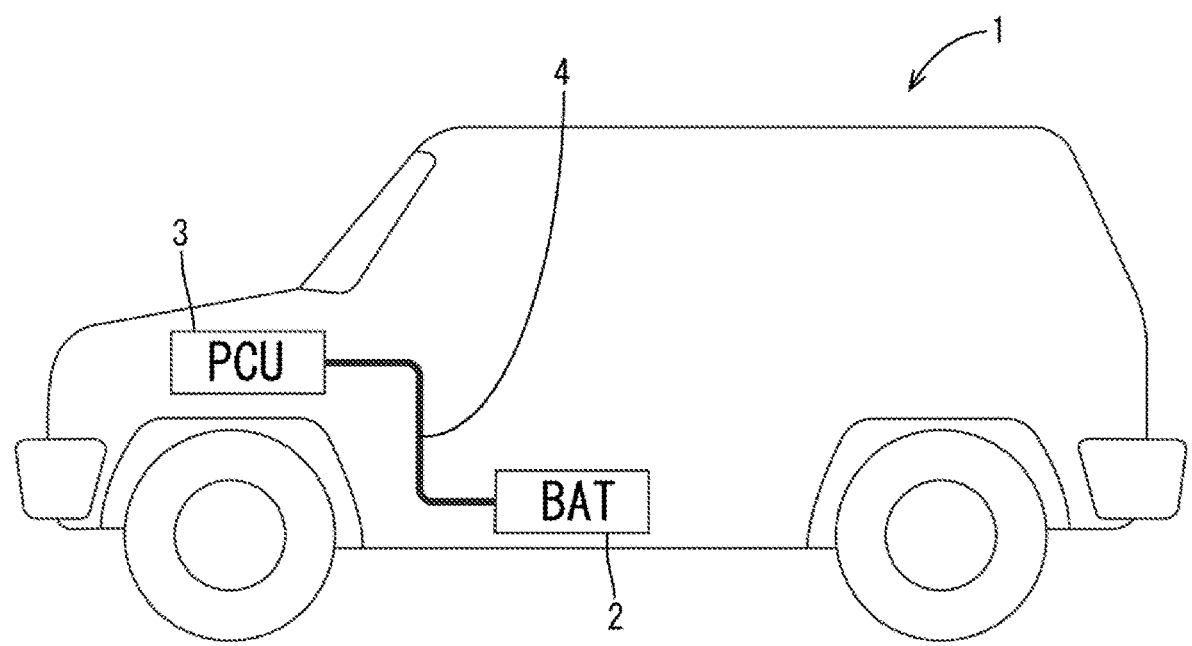
FIG. 14 is a schematic view illustrating a vehicle on which a power storage module according to the first embodiment is installed.

As illustrated in FIG. 14, the power storage pack 2 is disposed in the middle of the vehicle 1. A power control unit (PCU) 3 is disposed in the front of the vehicle 1. The power storage pack 2 and the PCU 3 are connected to each other via a wire harness 4. The power storage pack 2 is coupled to the wire harness 4 with a connector, which is not illustrated. The power storage pack 2 includes a power storage module (not illustrated) including multiple power storage components. The coupling structure 12 in the wiring board according to this disclosure is attached to the power storage module for use.

This embodiment relates to the coupling structure 12 in the wiring board in which a first flexible printed wiring board 10 (an example of a printed wiring board) and a second flexible printed wiring board 11 (an example of a flexible printed wiring board) that is overlaid on the first flexible printed wiring board 10 are coupled to each other. In the following description, an upper side and a lower side are defined for explanatory convenience. However, arrangement and an orientation of the coupling structure 12 in the wiring board are not limited.

[First Flexible Printed Wiring Board 10]

Figure 2:
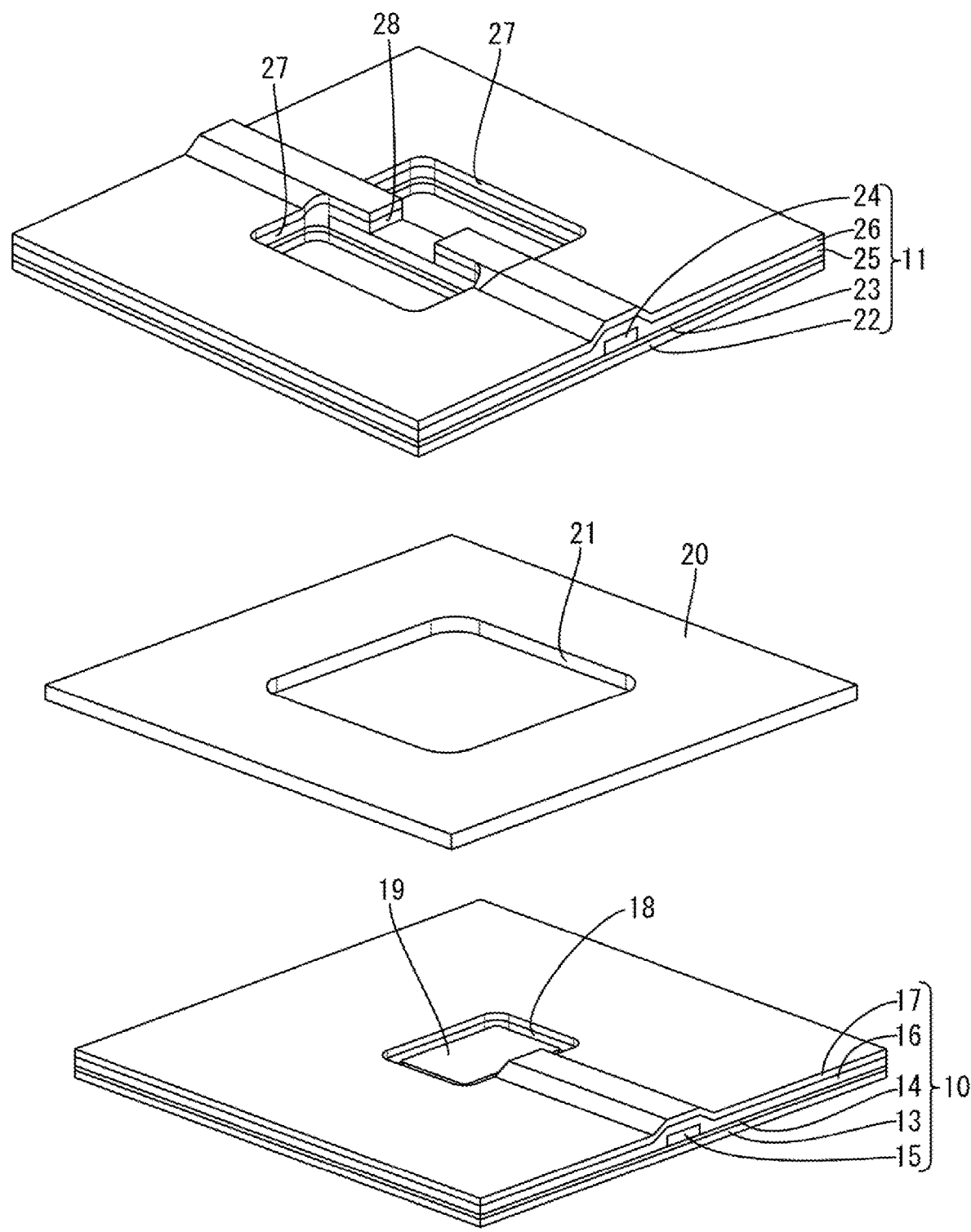
FIG. 2 is an exploded perspective view illustrating the multilayer structures of the first flexible printed wiring board and the second flexible printed wiring board.

As illustrated in FIGS. 1 and 2, the first flexible printed wiring board 10 includes a first base film 13, a first conductive line adhesive layer 14, a first conductive line 15, a first coverlay adhesive layer 16, and a first coverlay 17. The first conductive line adhesive layer 14 is applied on the first base film 13. The first conductive line 15 is bonded to the first base film 13 with the first conductive line adhesive layer 14. The first coverlay adhesive layer 16 is applied on the first base film 13 and the first conductive line 15. The first coverlay 17 is bonded to the first base film 13 and the first conductive line 15 with the first coverlay layer 16.

The first base film 13 is prepared by forming a synthetic resin having an insulating property into a film. The synthetic resin of the first base film 13 may be polyamide, polyimide, polyamide imide, and polyester such as polyethylene naphthalate. Polyamide, polyimide, and polyamide imide may be preferable in terms of mechanical strength including heat resistance.

The first conductive line 15 is formed by patterning a copper foil bonded to an upper surface of the first base film 13 with the first conductive line adhesive layer 14 using a known wire printing technology. A material of the first conductive line 15 is not limited as long as the material has electric conductivity. The material may be metal such as copper, aluminum, and nickel. Copper that is relatively inexpensive and has higher conductivity may be used. A thickness of the first conductive line adhesive layer 14 is not limited. In this embodiment, the thickness of the first conductive line 15 is equal to or slightly less than a thickness of the first conductive line 15.

The first coverlay 17 is bonded to an upper surface of the first base film 13 and an upper surface of the first conductive line 15 with the first coverlay adhesive layer 16. Specifically, the first base film 13 includes sections on which the first conductive line 15 is disposed. In this section, the first coverlay adhesive layer 16 and the first coverlay 17 are overlaid on the upper surface of the first conductive line 15. The first base film 13 includes sections on which the first conductive line 15 is not disposed. In this section, the first coverlay adhesive layer 16 and the first coverlay 17 are disposed on the upper surface of the first base film 13.

The first coverlay 17 is made of synthetic resin having an insulating property. Examples of the synthetic resin of the first coverlay 17 include polyimide resin, epoxy resin, phenol resin, acrylic resin, polyester resin, thermoplastic polyimide resin, polyethylene terephthalate resin, fluorine resin, and liquid crystal polymer. The polyimide resin may be preferable in terms of heat resistance.

The first coverlay 17 has flexibility. In the section of the first flexible printed wiring board 10, a section of the first coverlay 17 opposite the first conductive line 15 is raised upward corresponding to the thickness of the first conductive line 15.

The first coverlay 17 and the first coverlay adhesive layer 16 include first voids 18 at predefined positions. In this embodiment, each of the first void 18 has a rectangular shape when viewed from the upper side. The first conductive line 15 is disposed in the first voids 18. In this embodiment, the first conductive line 15 extends into the first voids 18 and includes an end in the first voids 18.

[Spacer 20]

As illustrated in FIGS. 1 and 2, the spacer 20 having a predefined thickness is disposed on the upper surface of the first flexible printed wiring board 10. The spacer is made of synthetic resin that may be selected from polypropylene, polyethylene, polybutylene terephthalate, polyethylene terephthalate, polyamide, polyimide, fluorine resin, liquid crystal polymer, and any other synthetic resins.

In this embodiment, an adhesive having adhesiveness is applied to an upper surface, a lower surface, or both of the spacer 20. With the adhesive, the spacer 20 is bonded to the first flexible printed wiring board 10 and the second flexible printed wiring board 11.

The spacer 20 includes a spacer void 21 at a position opposite the first void 18. The spacer void 21 has a rectangular shape when viewed from the upper side. A edge of the spacer void 21 is larger than an edge of the first void 18. When viewed from the upper side, the first void 18 is located inside the spacer void 21.

The spacer 20 has flexibility. In the section of the first flexible printed wiring board 10, the section of the first coverlay 17 opposite the first conductive line 15 is raised upward corresponding to the first conductive line 15. A section of the spacer 20 corresponding the section of the first coverlay 17 is also raised upward.

[Second Flexible Printed Wiring Board 11]

As illustrated in FIGS. 1 and 2, the second flexible printed wiring board 11 includes a second base film 22, a second conductive line adhesive layer 23, a second conductive line 24, a second coverlay adhesive layer 25, and a second coverlay 26. The second conductive line adhesive layer 23 is disposed on the second base film 22. The second conductive line 24 is bonded to the second base film 22 with the second conductive line adhesive layer 23. The second coverlay adhesive layer 25 is disposed on the second base film 22 and the second conductive line 24. The second coverlay 26 is bonded to the second base film 22 and the second conductive line 24 with the second coverlay adhesive layer 25.

The second base film 22 is made of the material of which the first base film 13 is made and thus the detail will not be described.

The second conductive line 24 is formed by patterning a copper foil bonded to an upper surface of the second base film 22 with the second conductive line adhesive layer 23 using the known wire printing technology. A material of the second conductive line 24 is similar to the material of the second conductive line 24 and thus the detail will not be described. A thickness of the second conductive line adhesive layer 23 is not limited. In this embodiment, the thickness of the second conductive line 24 is equal to or slightly less than a thickness of the second conductive line 24.

The second coverlay 26 is bonded to the upper surface of the second base film 22 and an upper surface of the second conductive line 24 with the second coverlay adhesive layer 25. Specifically, the second base film 22 includes sections on which the second conductive line 24 is disposed. In this section, the second coverlay adhesive layer 25 and the second coverlay 26 are overlaid on the upper surface of the second conductive line 24. The second base film 22 includes sections on which the second conductive line 24 is not disposed. In this section, the second coverlay adhesive layer 25 and the second coverlay 26 are disposed on the upper surface of the second base film 22.

The second coverlay 26 is made of the material of which the first coverlay 17 is made and thus the detail will not be described.

The second coverlay 26 has flexibility. In the section of the second flexible printed wiring board 11, a section of the second coverlay 26 opposite the second conductive line 24 is raised upward corresponding to the thickness of the second conductive line 24.

The second base film 22, the second conductive line adhesive layer 23, the second conductive line 24, the second coverlay adhesive layer 25, and the second coverlay 26 included in the second flexible printed wiring board 11 have flexibility. A section of the second flexible printed wiring board 11 corresponding to the section of the first flexible printed wiring board 10 raised upward is raised upward.

Figure 3:
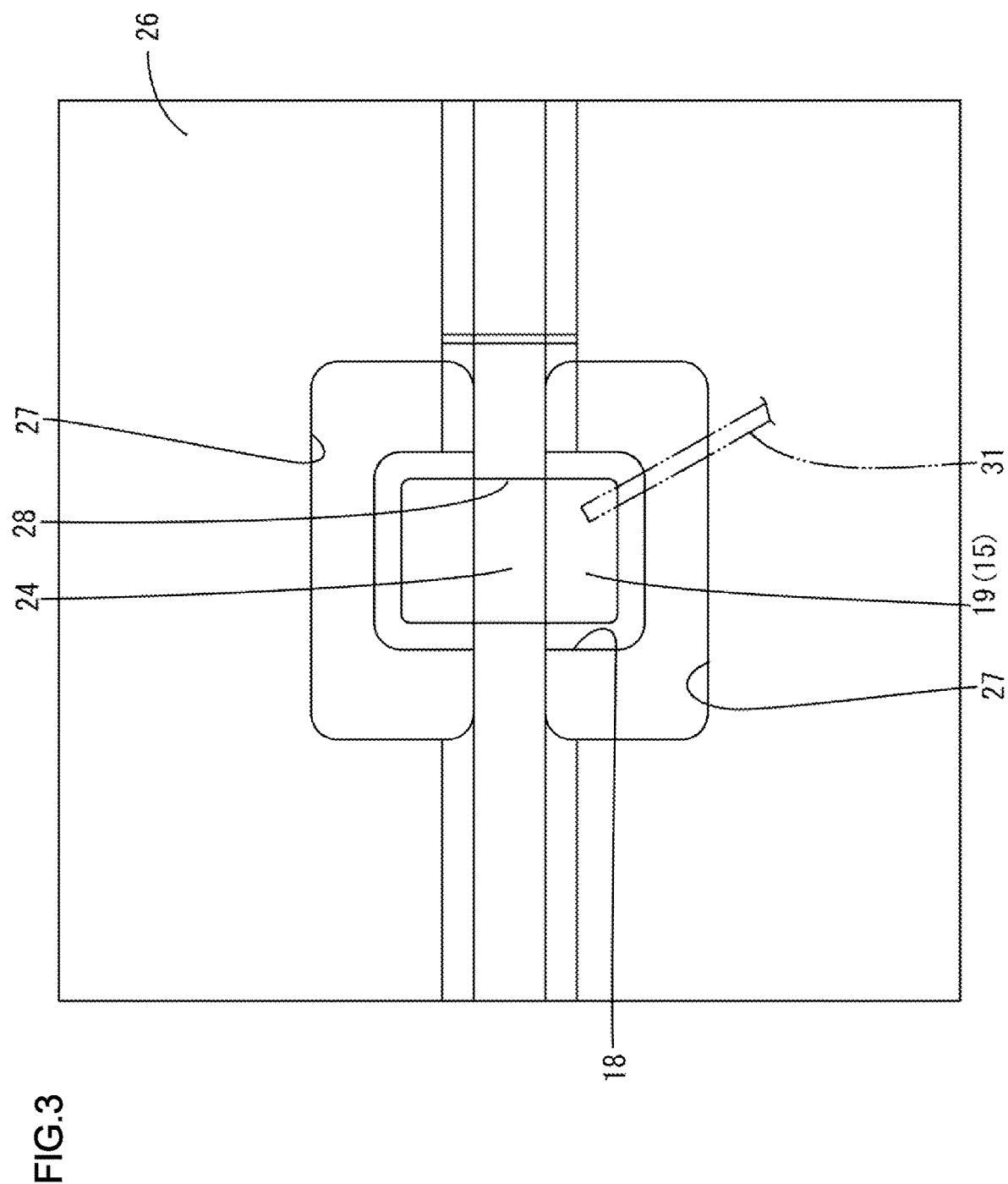
FIG. 3 is a plan view illustrating the multilayer structures of the first flexible printed wiring board and the second flexible printed wiring board.

As illustrated in FIG. 3, the second flexible printed wiring board 11 includes through holes 27 (an example of conduction-purpose through holes, an example of resin filling-purpose through holes) on sides of the second conductive line 24. The through holes 27 open through the second flexible printed wiring board 11 in a top-bottom direction. Each of the through holes 27 has a rectangular shape when viewed from the upper side. Each of the through holes 27 is elongated in a direction along a direction in which the second conductive line 24 extends. The first conductive line 15 is exposed in the through holes 27.

The spacer void 21 of the spacer 20 is larger than the through hole 27 of the second flexible printed wiring board 11. When viewed from the upper side, the edge of the spacer void 21 is not exposed in the through holes 27. The edge of the spacer void 21 is sandwiched between the first flexible printed wiring board 10 and the second flexible printed wiring board 11.

Sections of the second coverlay 26 and the second coverlay adhesive layer 25 between the through holes 27 include second voids 28. The second conductive line 24 is exposed through the second voids 28. The second voids 28 are located at the middle of the sections between the through holes 27 with respect to the direction in which the second conductive line 24 extends. With respect to the direction in which the second conductive line 24 extends, a length of the second voids 28 is about one-third of the length of the through holes 27.

As illustrated in FIG. 3, the second conductive line 24 is exposed through the second voids 28. An end 19 of the first conductive line 15 is exposed through the through holes 27.

[Solder 29]

Figure 4:
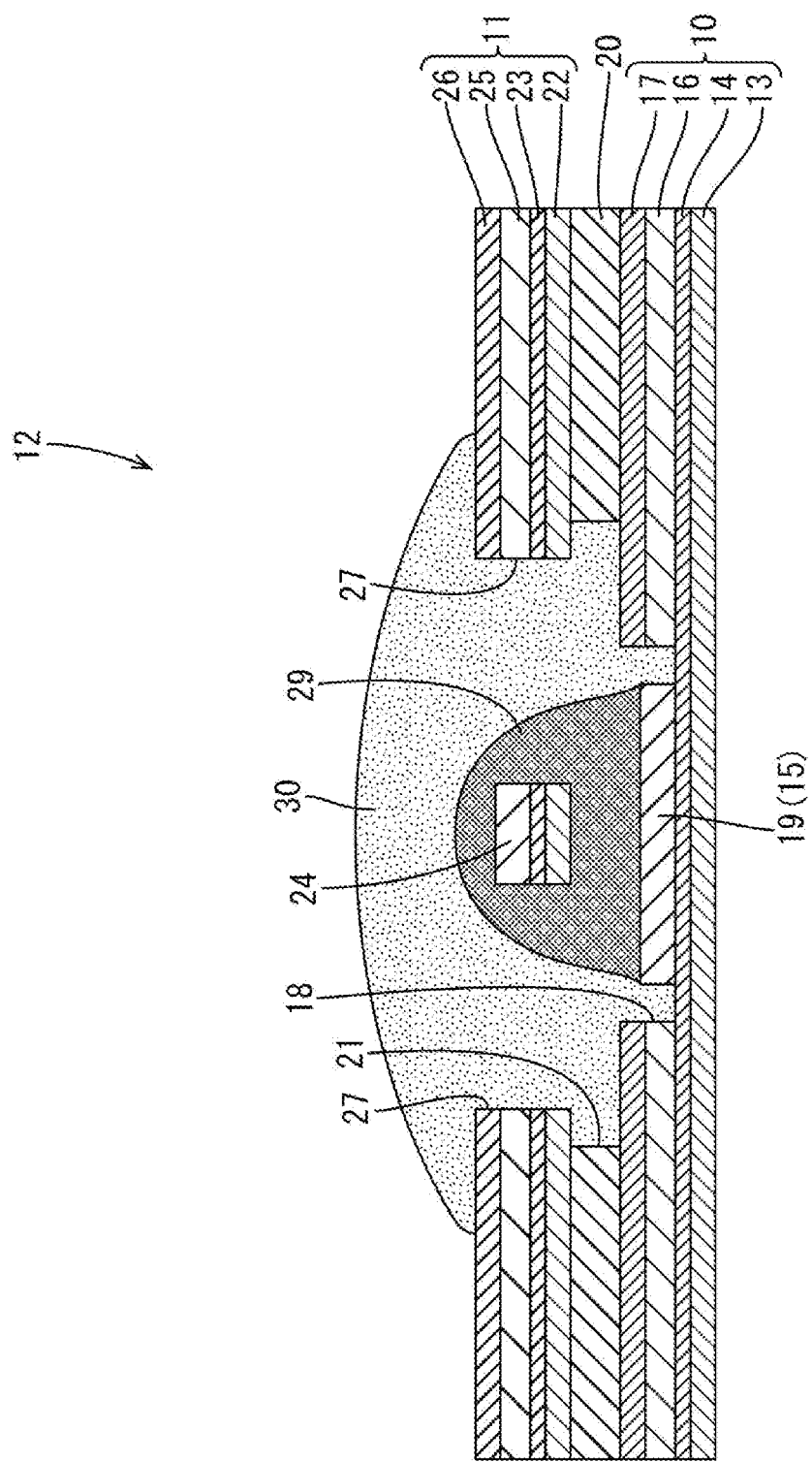
FIG. 4 is a cross-sectional view along line IV-IV in FIG. 7.
Figure 5:
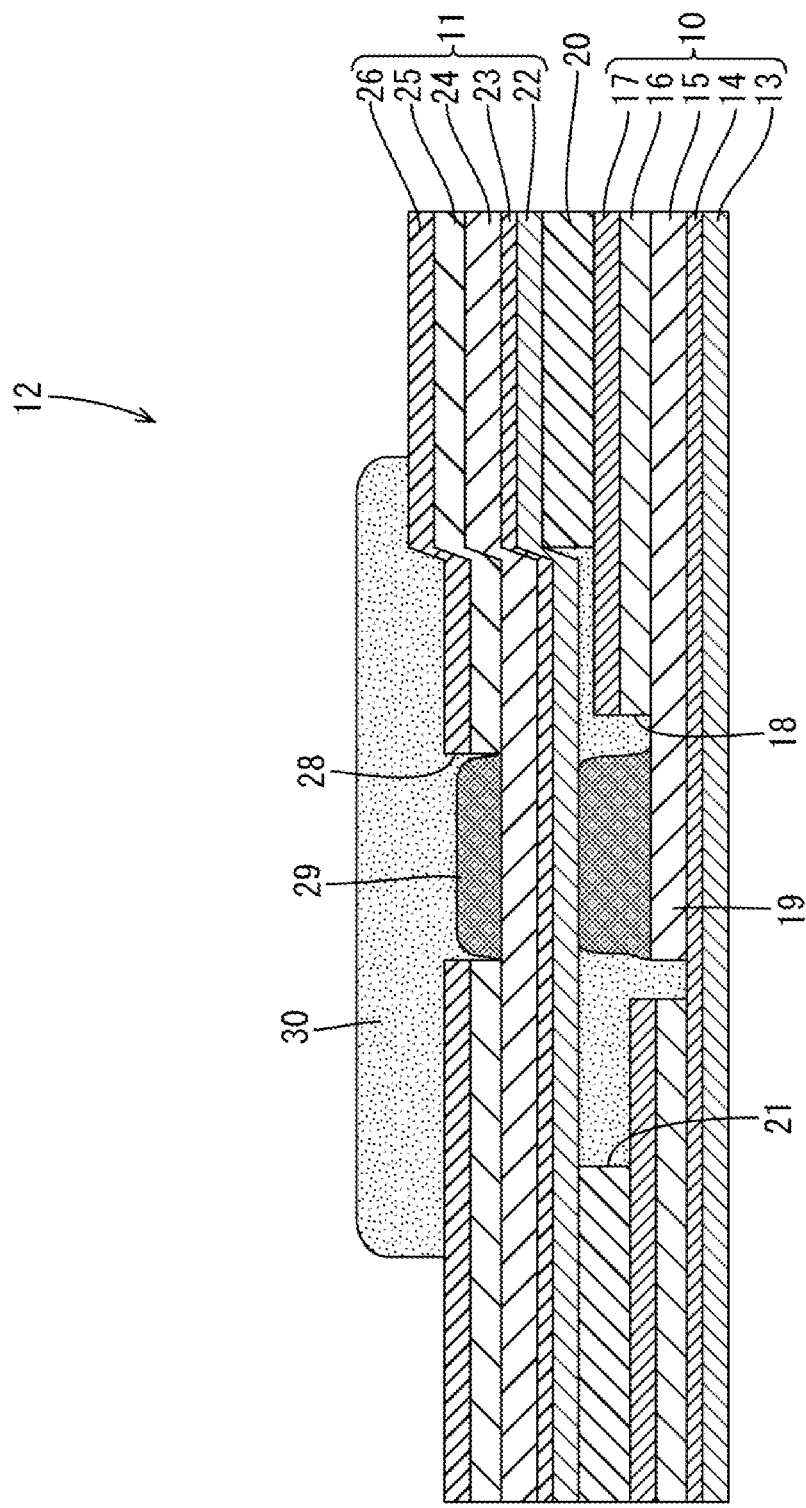
FIG. 5 is a cross-sectional view along line V-V in FIG. 7.

As illustrated in FIGS. 4 and 5, the first conductive line 15 disposed in the first voids 18 and the second conductive line 24 exposed through the second voids 28 are coupled to each other with a solder 29 (an example of a conductive member) that is solidified after melted. The solder 29 is disposed on the upper surface of the first conductive line 15 to cover the upper surface of the second conductive line 24 that is disposed above the first conductive line 15. As illustrated in FIG. 4, the solder 29 is formed in a mound shape on the first conductive line 15 to protrude upward. A position of the upper end portion of the solder 29 is not limited. The upper end portion of the solder 29 may be above the upper surface of the second coverlay 26, at the same height as the upper surface of the second coverlay 26, or below the upper surface of the second coverlay 26.

[Resin 30]

Figure 6:
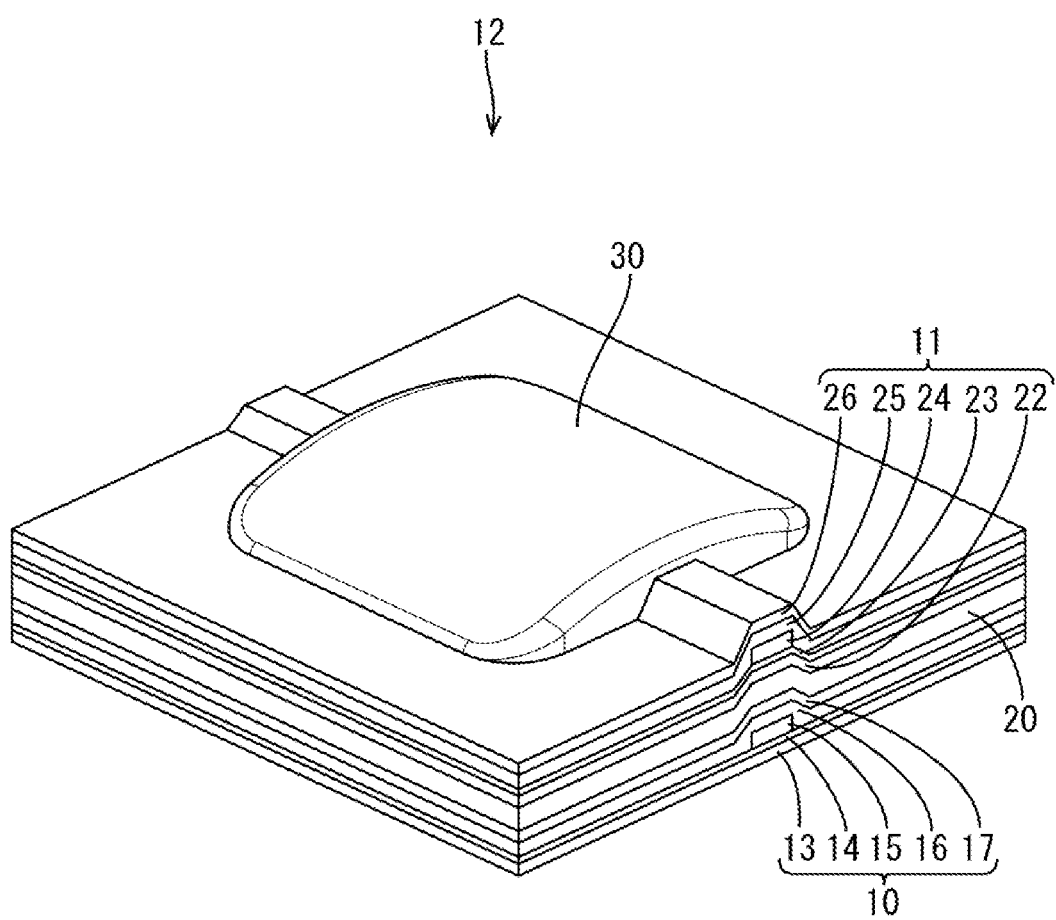
FIG. 6 is a perspective view illustrating the coupling structure in the wiring board.
Figure 7:
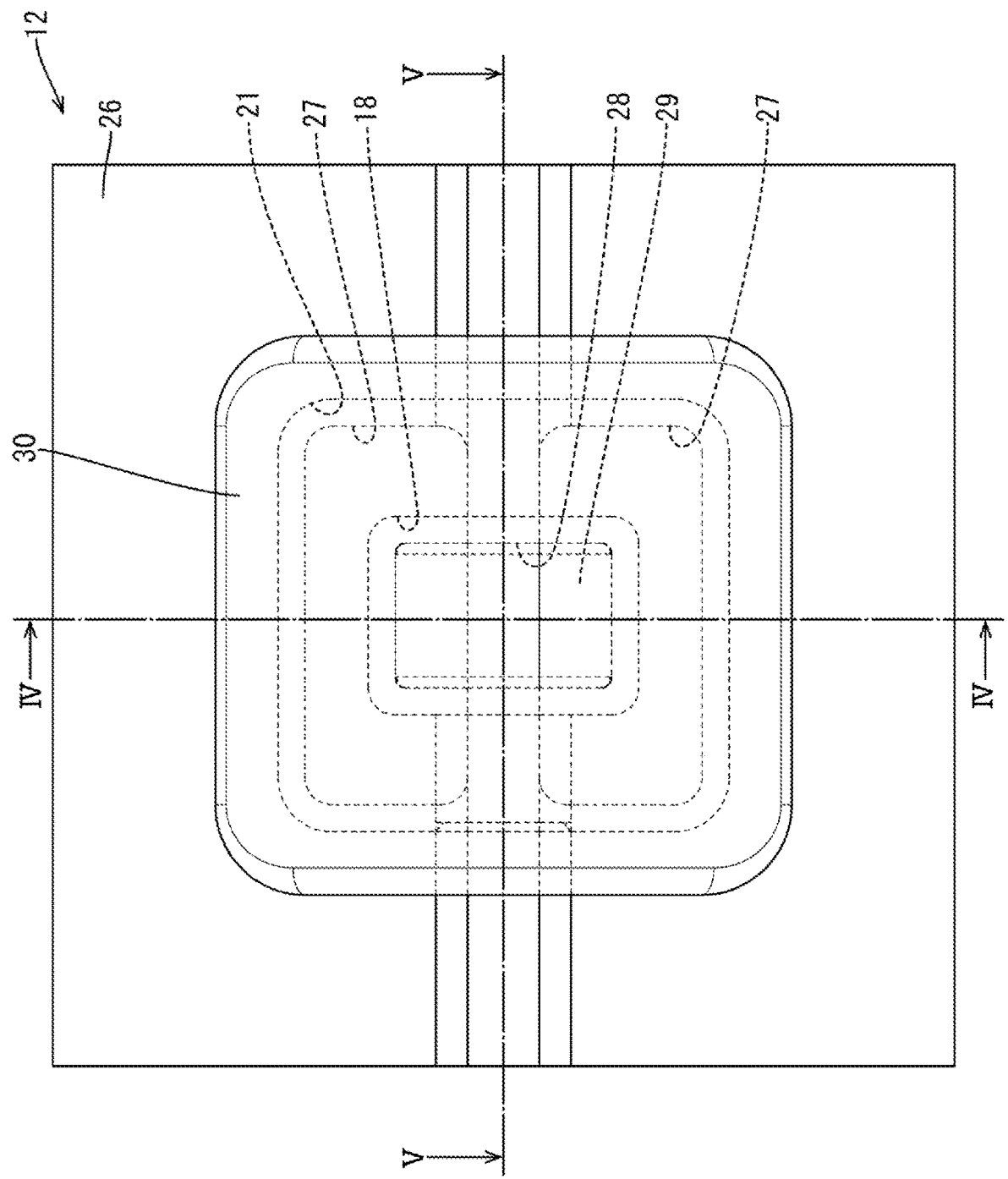
FIG. 7 is a plan view illustrating the coupling structure in the wiring board.

As illustrated in FIGS. 6 and 7, the upper end and sides of the solder 29 are covered with the resin 30 having an insulating property. The resin 30 may be selected from any synthetic resins such as epoxy resin, silicone resin, and photocurable resin where appropriate.

As illustrated in FIGS. 4 and 5, the first voids 18, the spacer void 21, the second voids 28, and the through holes 27 are filled with the resin 30. The resin 30 flows over the second voids 28 and the through holes 27 to the upper surface of the second flexible printed wiring board 11. When viewed from the upper side, a shape of the resin is rectangular slightly larger than the hole edges of the through holes 27. As illustrated in FIG. 6, the upper surface of the resin is gently curved, that is, the resin 30 is substantially in a mound shape.

The upper surface of the solder 29 is covered with the resin 30. The second voids 28 and the through holes 27 are covered with the resin 30. Sections of the solder 29 between the first flexible printed wiring board 10 and the second flexible printed wiring board 11 are covered with the resin 30 filling the first voids 18, the spacer void 21, and through holes 27.

Steps of Producing this Embodiment

Next, steps of producing the coupling structure 12 in the wiring board according to this embodiment will be described. The steps of the producing the wiring board are not limited those described below.

Figure 8:
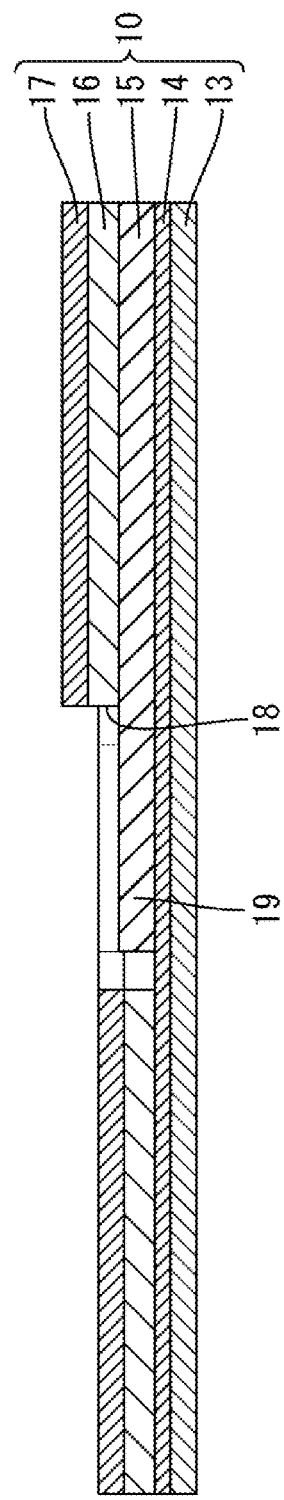
FIG. 8 is a cross-sectional view along line V-V in FIG. 7 illustrating the first flexible printed wiring board.

As illustrated in FIG. 8, the first conductive line adhesive layer 14 is applied to the upper surface of the first base film 13 and the copper foil is bonded. The copper foil is patterned by the known wiring printing method and the first conductive line 15 is formed. The first coverlay 17 that includes the first void 18 is bonded to the upper surface of the first base film 13 and the upper surface of the first conductive line 15. The first coverlay adhesive layer 16 may be formed on a lower surface of the first coverlay 17 in advance, or the first coverlay 17 may be bonded onto the first coverlay adhesive layer 16 after the first coverlay adhesive layer 16 is formed on the upper surface of the first base film 13 and the upper surface of the first conductive line 15.

Figure 9:
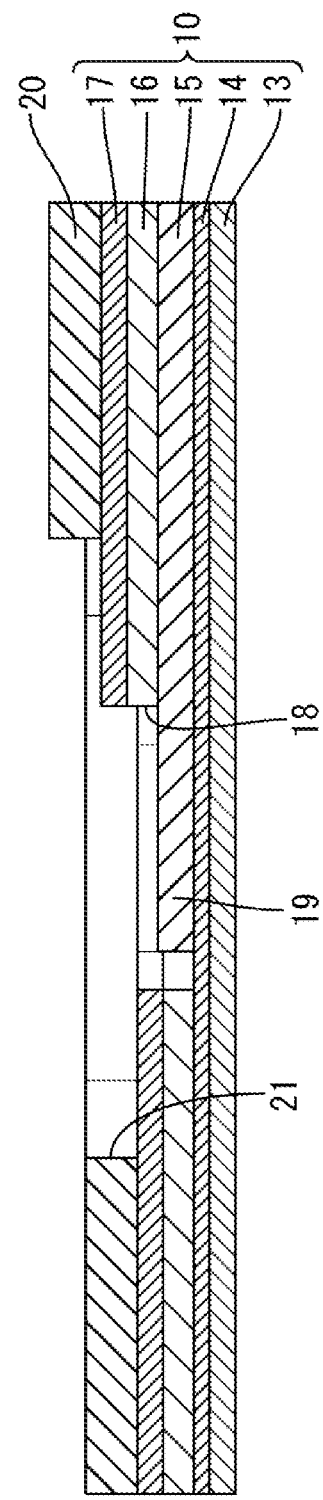
FIG. 9 is a cross-sectional view along line V-V in FIG. 7 illustrating a spacer disposed on the first flexible printed wiring board.

The spacer void 21 is formed in the spacer 20. As illustrated in FIG. 9, the spacer 20 is disposed on the upper surface of the first flexible printed wiring board 10. The spacer void 21 is positioned opposite the first voids 18. The first voids 18 are positioned inside the spacer void 21.

The second conductive line adhesive layer 23 is applied to the upper surface of the second base film 22 and the copper foil is bonded. The copper foil is patterned using the wire printing technology and the second conductive line 24 is formed. The second coverlay 26 that includes the second void 28 is bonded to the upper surface of the second base film 22 and the upper surface of the second conductive line 24. The second coverlay adhesive layer 25 may be formed on the lower surface of the second coverlay 26 in advance, or the second coverlay 26 may be bonded onto the second coverlay adhesive layer 25 after the second coverlay adhesive layer 25 is formed on the upper surface of the second base film 22 and the upper surface of the second conductive line 24. Two through holes 27 are formed by die-cutting sections of the second flexible printed wiring board 11 at positions adjacent to the second voids 28 beside the second conductive line 24.

Figure 10:
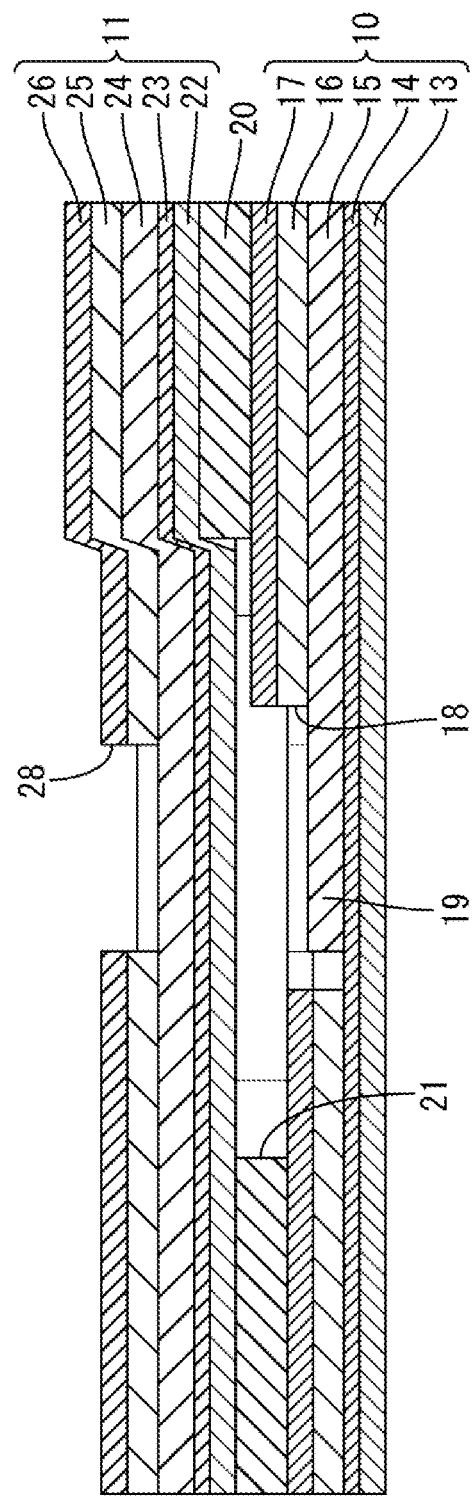
FIG. 10 is a cross-sectional view along line V-V in FIG. 7 illustrating the flexible printed wiring board disposed on the spacer.
Figure 11:
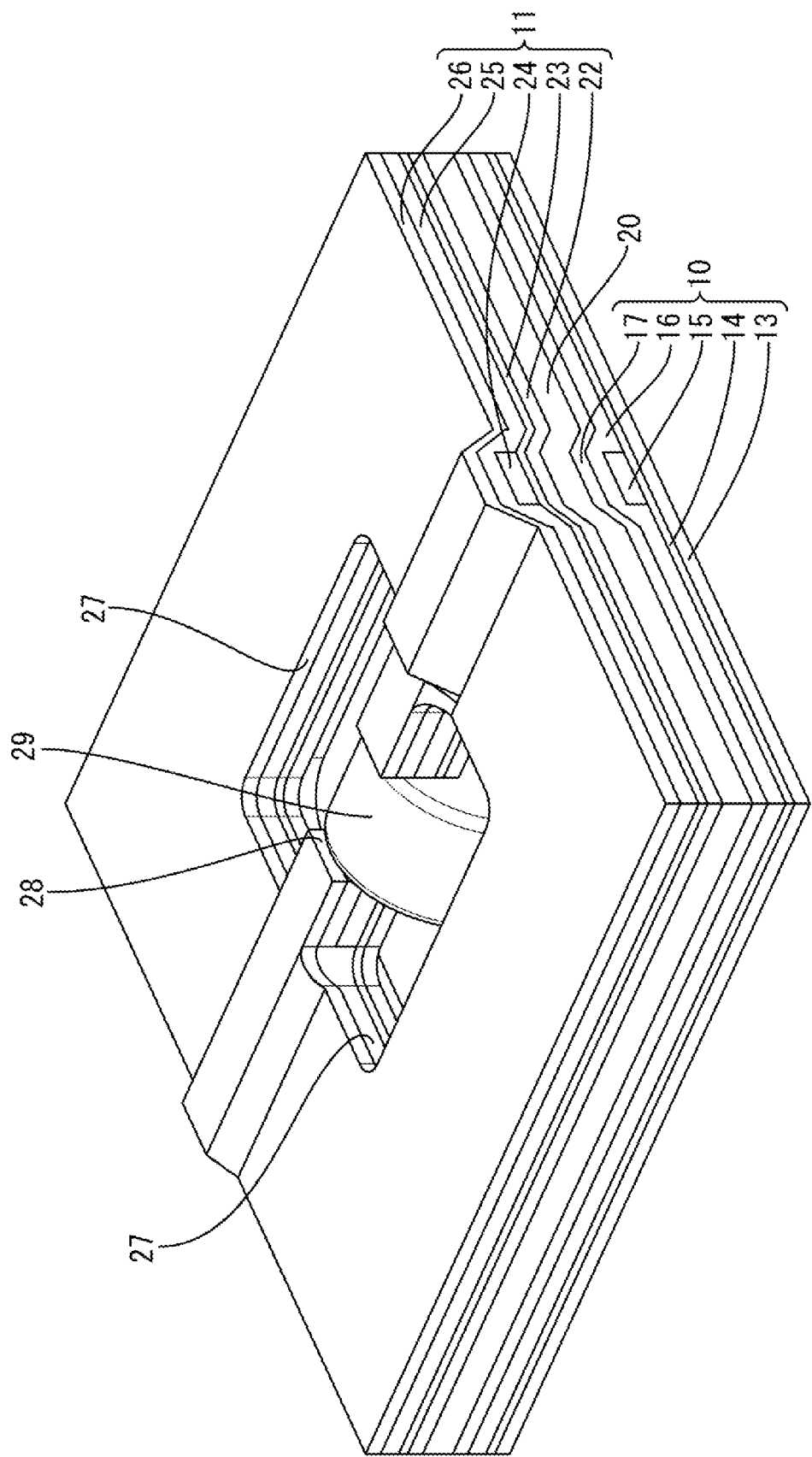
FIG. 11 is a perspective view illustrating electrical connection between a first conductive line and a second conductive line with a solder.

As illustrated in FIG. 10, the second flexible printed wiring board 11 is disposed on the upper surface of the spacer 20 bonded to the upper surface of the first flexible printed wiring board 10. The spacer 20 and the second flexible printed wiring board 11 may be bonded to each other with an adhesive layer formed on the spacer 20, which is not illustrated.

Figure 12:
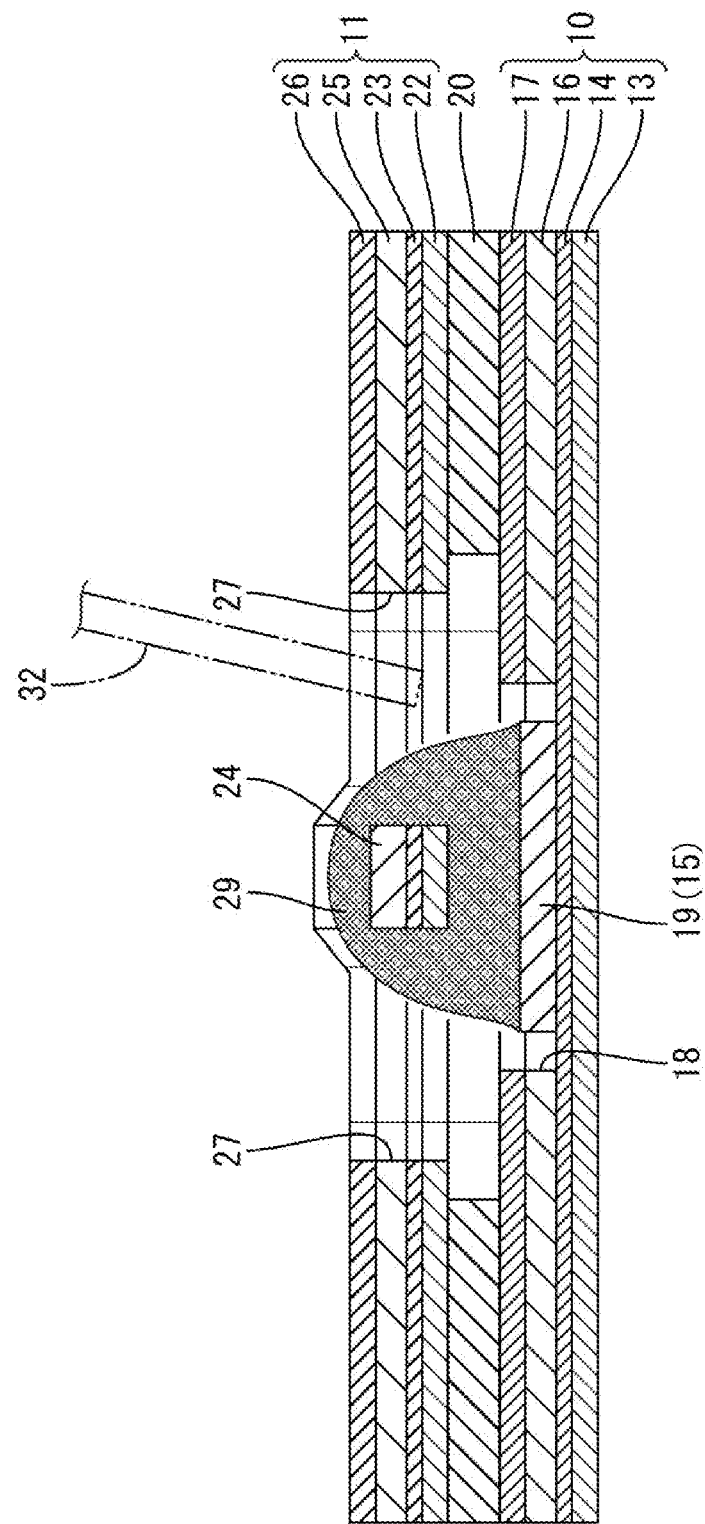
FIG. 12 is a cross-sectional view along line IV-IV in FIG. 7 illustrating the electrical connection between the first conductive line and the second conductive line with the solder.
Figure 13:
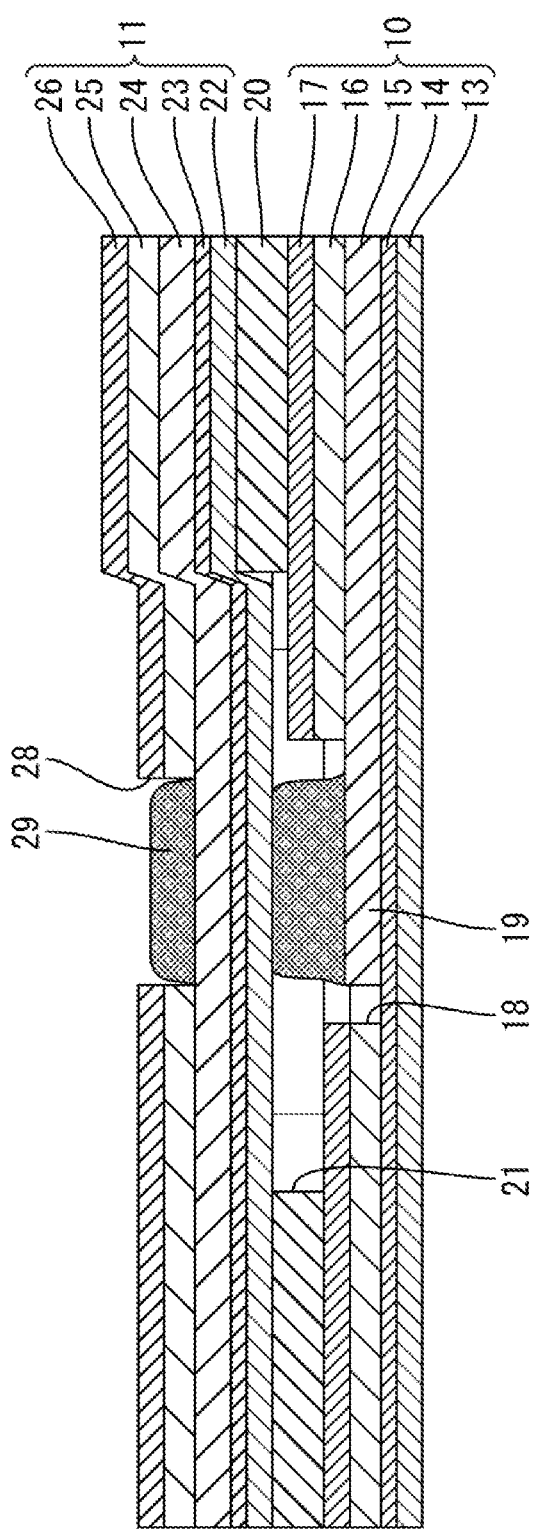
FIG. 13 is a cross-sectional view along line V-V in FIG. 7 illustrating the electrical connection between the first conductive line and the second conductive line with the solder.

As illustrated in FIG. 3, a solder is applied to the first conductive line 15 exposed through the through holes 27 with a soldering iron 31 that contacts the solder. The solder 29 melted with the soldering iron 31 is disposed on the upper surface of the first conductive line 15 and formed in the mound shape to protrude upward. The upper surface of the second conductive line 24 is covered with the melted solder 29 (see FIG. 11). The soldering iron 31 is moved away from the first conductive line 15 and the solder 29 is solidified. As illustrated in FIGS. 12 and 13, the first conductive line 15 and the second conductive line 24 are electrically connected to each other with the solder 29.

The soldering between the first conductive line 15 and the second conductive line 24 may be conducted by printing solder pastes on the first conductive line 15 and the second conductive line 24 using screen printing technology and then heating the solder pastes with a reflow oven, application of laser beam, or blowing. Alternatively, a solder paste may be applied to the end 19 of the first conductive line 15 and solidified after melted by heating, and then a solder may be added using the soldering iron 31 and the soldering is conducted after the second flexible printed wiring board 11 is stacked.

As illustrated in FIG. 12, a nozzle 32 is inserted into the through holes 27 and the resin 30 injected from the nozzle 32 into the through holes 27. The through holes 27 are filled with the resin 30 and the injection of the resin 30 is terminated when the resin 30 flows over the hole edge of the through hole 27 and protrudes upward. The resin 30 that is covered with the solder 29 is solidified. The first flexible printed wiring board 10 and the second flexible printed wiring board 11 are coupled. The coupling structure 12 in the wiring board according to this embodiment is complete (see FIG. 1).

Operation and Effects of this Embodiment

Next, operation and effects of this embodiment will be described. The coupling structure 12 in the wiring board according to this embodiment includes the first flexible printed wiring board 10 and the second flexible printed wiring board 11 that is overlaid on the first flexible printed wiring board 10. The first flexible printed wiring board 10 includes the first conductive line 15 on the surface adjacent to the second flexible printed wiring board 11. The second flexible printed wiring board 11 includes the second conductive line 24 on the surface on the opposite side from the first flexible printed wiring board 10. The second flexible printed wiring board 11 includes the through holes 27 adjacent to the second conductive line 24. A portion of the first conductive line 15 of the first flexible printed wiring board 10 is disposed inside the through holes 27. The first conductive line 15 of the first flexible printed wiring board 10 and the second conductive line 24 of the second flexible printed wiring board 11 are electrically connected to each other with the solder 29 disposed inside the through holes 27. The solder 29 is covered with the resin having the insulating property.

Because the solder 29 is covered with the resin 30 having the insulating property, the solder 29 is less likely to be subject to dew condensation water and thus the dew condensation water is less likely to enter into the through holes 27 via the solder 29. According to the configuration, the waterproof performance of the coupling structure 12 in the wiring board improves.

Further, the dew condensation water on the solder 29 is less likely to stream down the solder 29 and enter between the first flexible printed wiring board 10 and the second flexible printed wiring board 11. According to the configuration, the waterproof performance of the coupling structure 12 in the wiring board improves.

In this embodiment, the second flexible printed wiring board 11 includes the through holes 27 that is filled with the resin 30 between the first flexible printed wiring board 10 and the second flexible printed wiring board 11.

Through filling of the through holes 27 with the resin 30, which is a simple method, the sections of the solder 29 between the first flexible printed wiring board 10 and the second flexible printed wiring board 11 are covered with the resin 30. Therefore, the waterproof performance between the first flexible printed wiring board 10 and the second flexible printed wiring board 11 improves.

In this embodiment, the through holes 27 double as the conduction-purpose through holes and the resin filling-purpose through holes. According to the configuration, in comparison to a configuration in which the conduction-purpose through holes and the resin filling-purpose through holes are separately provided, the coupling structure 12 in the wiring board is simplified.

In this embodiment, the second flexible printed wiring board 11 includes the through holes 27 beside the second conductive line 24.

Because the through holes 27 that double as the conduction-purpose through holes and the resin filling-purpose through holes are beside the second conductive line 24, the first conductive line 15 and the second conductive line 24 are electrically connected to each other with ease. Further, the solder 29 that electrically connect the first conductive line 15 to the second conductive line 24 is easily covered with the resin 30.

In this embodiment, the spacer 20 is disposed between the first flexible printed wiring board 10 and the second flexible printed wiring board 11. The spacer 20 includes the spacer void 21 at the position opposite the through holes 27.

Because the spacer 20 is disposed between the first flexible printed wiring board 10 and the second flexible printed wiring board 11, a space filled with the resin 30 is provided between the first flexible printed wiring board 10 and the second flexible printed wiring board 11. Because the space between the first flexible printed wiring board 10 and the second flexible printed wiring board 11 is properly filled with the resin 30, the waterproof performance of the coupling structure in the wiring board improves.

In this embodiment, at least one of the surfaces of the spacer 20 have adhesiveness.

Therefore, the spacer 20 is bonded to the first flexible printed wiring board 10 or the second flexible printed wiring board 11. According to the configuration, the entrance of water between the spacer 20 and the first flexible printed wiring board 10 or the second flexible printed wiring board 11 is reduced and thus the waterproof performance of the coupling structure 12 in the wiring board improves.

The coupling structure 12 in the wiring board according to this embodiment is for a vehicle and installed on the vehicle 1. This embodiment is advantageous for the environment that is subject to condensation such as in the vehicle 1.

Second Embodiment

Figure 15:
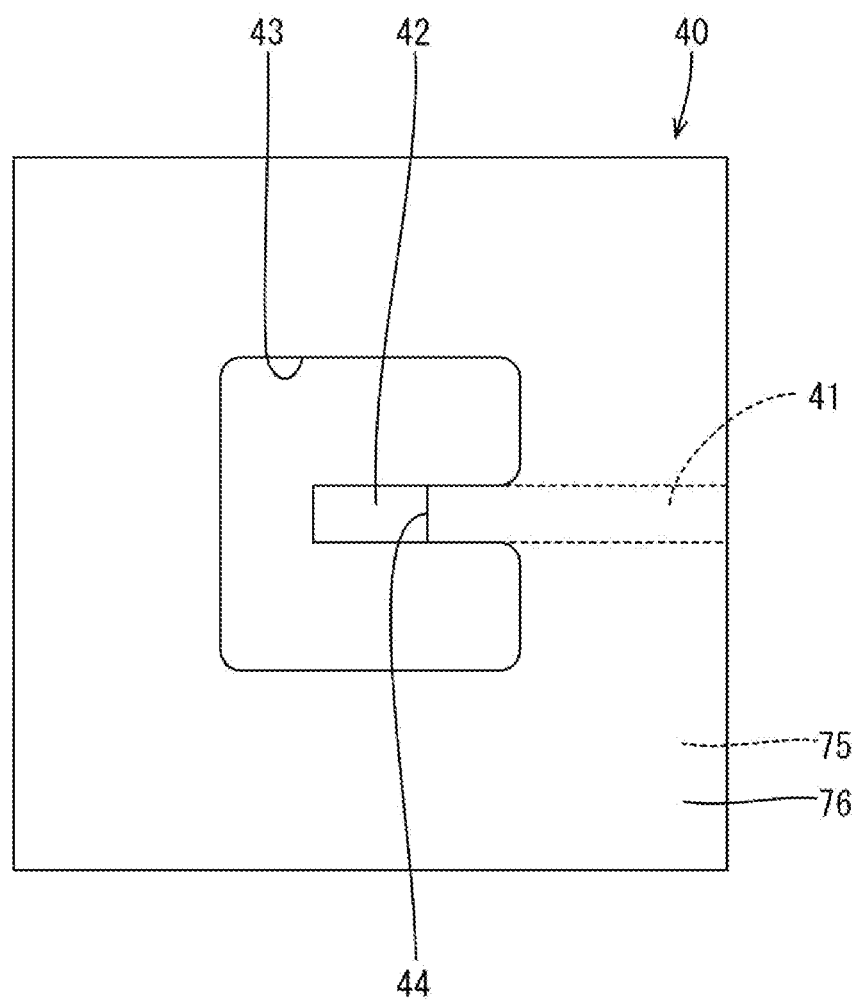
FIG. 15 is a plan view illustrating a second flexible printed wiring board according to a second embodiment.

A second embodiment of the present disclosure will be described with reference to FIG. 15. This embodiment includes a second flexible printed wiring board 40 having a configuration different from the first embodiment.

This embodiment includes a second conductive line 41 that includes an end 42. The second flexible printed wiring board 40 includes through holes 43 (an example of resin filling-purpose through holes, an example of conduction-purpose through holes) that are formed to surround the end 42 of the second conductive line 41. The through holes 43 have a C-shape when viewed from the upper side.

The second coverlay 76 and the second coverlay adhesive layer 75 include second voids 44 at a position opposite the end 42 of the second conductive line 41. The end 42 of the second conductive line 41 is exposed through the second voids 44.

Configurations other than the configuration describe above are similar to the configurations of the first embodiment. Components the same as the components of the first embodiment will be indicated by the reference signs used to indicate the components of the first embodiment and will not be repeatedly described.

This embodiment is preferable for the second conductive line 41 that includes the end 42.

Third Embodiment

Figure 16:
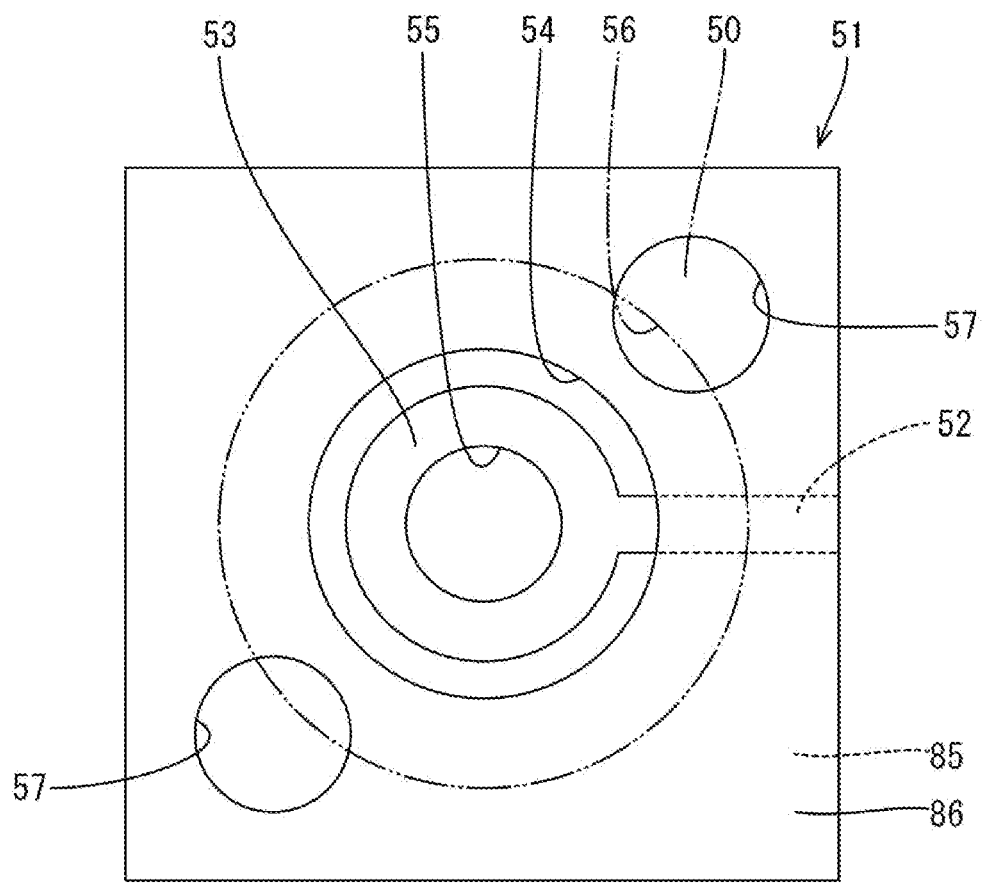
FIG. 16 is a plan view illustrating a second flexible printed wiring board according to a third embodiment.

A third embodiment of the present disclosure will be described with reference to FIG. 16. This embodiment includes a spacer 50 and a second flexible printed wiring board 51 having configurations different from the first embodiment.

This embodiment includes a second conductive line 52 that includes an end 53. The end 53 of the second conductive line 52 has a round shape when viewed from the upper side. The second coverlay 86 and the second coverlay adhesive layer 85 include second voids 54 formed at a position opposite the end 53 of the second conductive line 52. Hole edges of the second voids 54 have a round shape that is larger than the end 53 of the second conductive line 52 when viewed from the upper side. Therefore, the end 53 of the second conductive line 52 is exposed in the second voids 54.

Conduction-purpose through holes 55 are formed at the center of the end 53 of the second conductive line 52. The conduction-purpose through holes 55 open through the second conductive line 52, the second conductive line adhesive layer 23, and the second base film 22. Hole edges of the conduction-purpose through holes 55 have a round shape when viewed from the upper side. The first conductive line 15 is exposed in the conduction-purpose through holes 55 when viewed from the upper side.

The spacer 20 includes a spacer void 56 at a position opposite the conduction-purpose through holes 55 and the second voids 54. An edge of the spacer void 56 has a round shape that is larger than the edges of the second voids 54 when viewed from the upper side.

The second flexible printed wiring board 51 includes two resin filling-purpose through holes 57 at positions opposite the edge of the spacer void 56. Sections of the edge of the spacer void 56 are exposed in the resin filling-purpose through holes 57 when viewed from the upper side. The resin filling-purpose through holes 57 are symmetric about the center of the conduction-purpose through holes 55. Hole edges of the resin filling-purpose through holes 57 have a round shape when viewed from the upper side.

Configurations other than the configuration describe above are similar to the configurations of the first embodiment. Components the same as the components of the first embodiment will be indicated by the reference signs used to indicate the components of the first embodiment and will not be repeatedly described.

An example of steps of producing this embodiment will be described. The steps of producing this embodiment are not limited to the description below.

The conduction-purpose through holes 55 are filled with a solder paste, which is not illustrated, and then the solder paste, which is not illustrate, is disposed on an upper surface of the end 53 of the second conductive line 52. Known reflow soldering is performed with heating in a reflow oven. Through the steps, the first conductive line 15 and the second conductive line 52 are electrically connected with the solder 29.

The solder 29 on the end 53 of the second conductive line 52 is covered with the resin 30. The nozzle 32 is inserted into one of the resin filling-purpose through holes 57 to fill the resin filling-purpose through hole 57 and the spacer void 56 with the resin 30. When the resin flows out of the other resin filling-purpose through holes 57, the injection of the resin is terminated. When the resin 30 is solidified, the coupling structure 12 in the wiring board is complete.

Fourth Embodiment

Figure 17:
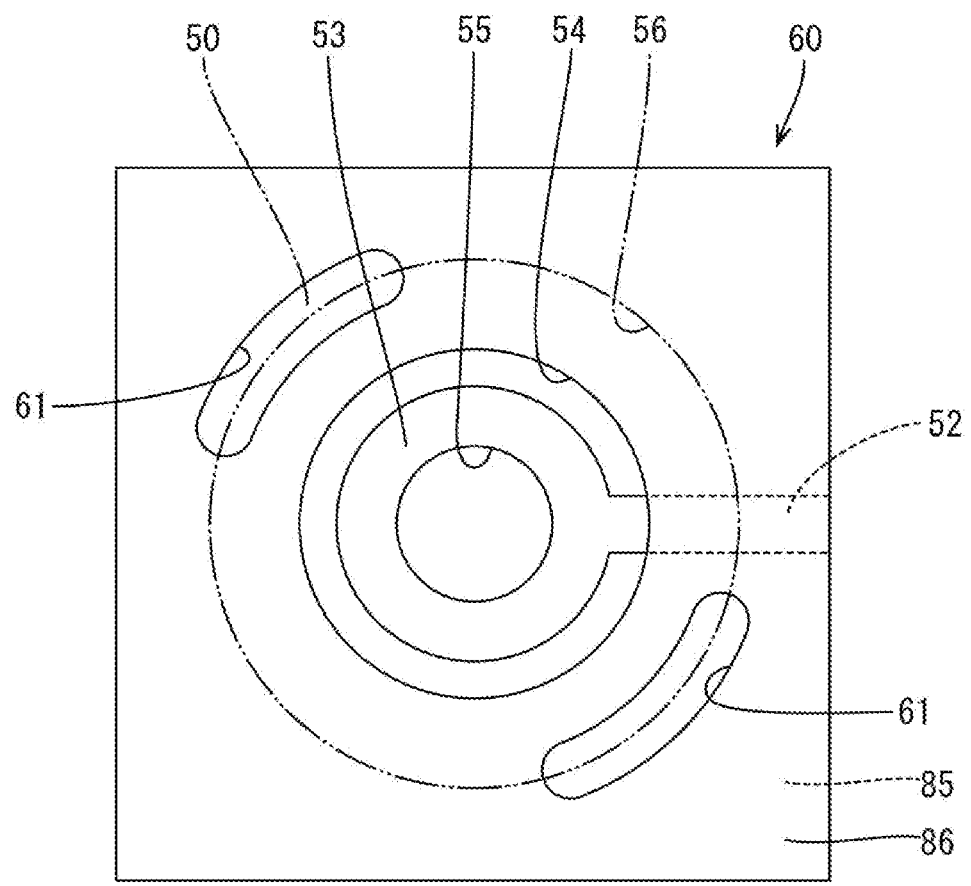
FIG. 17 is a plan view illustrating a second flexible printed wiring board according to a fourth embodiment.

A fourth embodiment of the present disclosure will be described with reference to FIG. 17. This embodiment includes a second flexible printed wiring board 60 having a configuration different from the third embodiment.

This embodiment includes resin filling-purpose through holes 61 that have an arc shape along an edge of the spacer void 56. According to the configuration, the filling of the spacer void 56 with the resin 30 can be easily performed.

Configurations other than the configuration describe above are similar to the configurations of the third embodiment. Components the same as the components of the first embodiment will be indicated by the reference signs used to indicate the components of the third embodiment and will not be repeatedly described.

Other Embodiments (1) In the first to the fourth embodiment, the first flexible printed wiring board 10 is provided as an example of the printed wiring board. However, the example is not limited to the first flexible printed wiring board 10. For example, a rigid printed wiring board may be used.
(2) The resin filling-purpose through holes 57 and 61 may be formed in the printed wiring boards.
(3) The spacer 20 may not have the adhesiveness.
(4) The spacer 20 may be formed from an adhesive layer applied to the upper surface of the first flexible printed wiring board 10. The spacer 20 may be omitted.
(5) The conductive member may be a synthetic resin material that includes a metal material.
(6) The through holes 27 may be formed on only one of the sides of the second conductive line 24.
(7) The conduction-purpose through holes and the resin filling-purpose through holes may have any shapes.
(8) The first conductive line adhesive layer 14 and the second conductive line adhesive layer 23 may be omitted.
(9) The first coverlay adhesive layer 16 and the second coverlay adhesive layer 25 may be omitted. The first coverlay adhesive layer 16 and the second coverlay adhesive layer 25 may be formed by printing or from photosensitive insulating films.

EXPLANATION OF SYMBOLS

1: Vehicle
2: Power storage pack
3: PCU
4: Wire harness
10: First flexible printed wiring board
11, 40, 51, 60: Second flexible printed wiring board
12: Coupling structure 13: First base film
14: First conductive line adhesive layer
15: First conductive line
16: First coverlay adhesive layer
17: First coverlay
18: First void
19: End
20, 50: Spacer
21, 56: Spacer void
22: Second base film
23: Second conductive line adhesive layer
24, 41, 52: Second conductive line
25: Second coverlay adhesive layer
26: Second coverlay
27, 43: Through hole
28, 44, 54: Second void
29: Solder
30: Resin
32: Nozzle
42: End
53: End
55: Conduction-purpose through hole
56: Spacer void
57: Resin filling-purpose through hole
61: Resin filling-purpose through hole

The invention claimed is:

1. A coupling structure in a wiring board comprising:
a printed wiring board; and
a flexible printed wiring board overlaid on the printed wiring board, wherein
the printed wiring board includes a first conductive line on a surface adjacent to the flexible printed wiring board,
the flexible printed wiring board includes a second conductive line on a surface on an opposite side from the printed wiring board,
the flexible printed wiring board includes a conduction-purpose through hole adjacent to the second conductive line and in which a section of the first conductive line is disposed,
the first conductive line of the printed wiring board and the second conductive line of the flexible wiring board are electrically connected to each other with a conductive member disposed in the conduction-purpose through hole, and
the conductive member is covered with a resin having an insulating property,
at least one of the printed wiring board and the flexible printed wiring board includes a resin filling-purpose through hole for filling the resin between the printed wiring board and the flexible printed wiring board,
the resin filling-purpose through hole is filled with the resin,
the flexible printed wiring board includes through holes on sides of the second conductive line,
the through holes double as the conduction-purpose through hole and the resin filling-purpose through hole,
the coupling structure further comprises a spacer between the printed wiring board and the flexible printed wiring board,
the spacer includes a spacer void at a position opposite the through holes, and
the spacer void is larger than the through holes.

2. The coupling structure in the wiring board according to claim 1, wherein the spacer includes surfaces, at least one of which has adhesiveness.

3. The coupling structure in the wiring board according to claim 1, wherein the coupling structure is to be installed in a vehicle.

4. A coupling structure in a wiring board comprising:
a printed wiring board; and
a flexible printed wiring board overlaid on the printed wiring board, wherein
the printed wiring board includes a first conductive line on a surface adjacent to the flexible printed wiring board,
the flexible printed wiring board includes a second conductive line on a surface on an opposite side from the printed wiring board,
the flexible printed wiring board includes a conduction-purpose through hole adjacent to the second conductive line and in which a section of the first conductive line is disposed,
the first conductive line of the printed wiring board and the second conductive line of the flexible wiring board are electrically connected to each other with a conductive member disposed in the conduction-purpose through hole,
the conductive member is covered with a resin having an insulating property,
at least one of the printed wiring board and the flexible printed wiring board includes a resin filling-purpose through hole for filling the resin between the printed wiring board and the flexible printed wiring board,
the resin filling-purpose through hole is filled with the resin,
the coupling structure further comprises a spacer between the printed wiring board and the flexible printed wiring board,
the spacer includes a spacer void at a position opposite the conduction-purpose through holes, and
the resin filling-purpose through hole is at a position opposite an edge of the spacer void.

5. A wiring board comprising:
a printed wiring board including:
a first base including a first surface;
a first conductive line on the first surface; and
a first coverlay covering the first surface and the first conductive line, the overlay including a first void through which an end portion of the first conductive line is exposed;
a flexible printed wiring board overlaid on the printed wiring board, the flexible printed wiring board including:
a second base including a second surface on an opposite side from the first surface of the first base and two through holes;
a second conductive line between the through holes on the second surface, the second conductive line including side edges aligned with sections of hole edges of the through holes, respectively;
a second coverlay covering the second surface and the second conductive line, the second coverlay including a second void through which a section of the second conductive line opposite the end portion of the first conductive line is exposed, the second coverlay including two through holes continuing into the through holes of the second base, respectively, sections of hole edges of the through holes being aligned with the side edges of the second conductive line, respectively;
a solder covering the end portion of the first conductive line and the section of the second conductive line and electrically connecting the end portion of the first conductive line to the section of the second conductive line; and a resin having an insulating property and filling the first void, the second void, and the through holes, the resin covering the solder.

6. The wiring board according to claim 5, wherein the first coverlay is bonded to the first surface of the first base and the first conductive line except for the end portion, and the second coverlay is bonded to the second surface of the second base and the second conductive line except for the second opposite the end portion of the first conductive line.

7. The wiring board according to claim 5, further comprising a spacer between the printed wiring board and the flexible printed wiring board, the spacer including a void continuing into the first void and the through holes and being filled with the resin.

8. The wiring board according to the claim 7, wherein the void of the spacer is larger than the first void.

9. The wiring board according to claim 7, wherein the spacer includes surfaces opposite the printed wiring board and the flexible printed wiring board, respectively, and at least one of the surfaces of the spacer has adhesiveness.

* * * * *